(12) United States Patent
Koo et al.

(10) Patent No.: US 9,007,072 B2
(45) Date of Patent: Apr. 14, 2015

(54) CAPACITOR SENSOR CAPABLE OF CONTROLLING SENSITIVITY

(75) Inventors: Ja Choon Koo, Seoul (KR); Hyouk Ryeol Choi, Gunpo-si (KR); Hyung Pil Moon, Seongnam-si (KR); Young Kwan Lee, Seoul (KR); Jae Do Nam, Seoul (KR); Baek Chul Kim, Seoul (KR); Jin Ah Chung, Seongnam-si (KR); Sung Gi Kim, Gangneung-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 267 days.

(21) Appl. No.: 13/569,427

(22) Filed: Aug. 8, 2012

(65) Prior Publication Data

US 2013/0093437 A1    Apr. 18, 2013

(30) Foreign Application Priority Data

Aug. 9, 2011  (KR) .................. 10-2011-0078879

(51) Int. Cl.
| | | |
|---|---|---|
| G01R 27/26 | (2006.01) | |
| G01D 5/24 | (2006.01) | |
| G01D 5/241 | (2006.01) | |
| G01L 1/14 | (2006.01) | |
| G01L 25/00 | (2006.01) | |
| G01L 5/16 | (2006.01) | |

(52) U.S. Cl.
CPC .............. *G01R 27/2605* (2013.01); *G01D 5/24* (2013.01); *G01D 5/2412* (2013.01); *G01L 1/142* (2013.01); *G01L 25/00* (2013.01); *G01L 5/165* (2013.01)

(58) Field of Classification Search
CPC ...... G01R 27/26; G01R 27/2605; H01G 7/00; H01G 5/00; H01G 5/04; H01G 5/06; H01G 5/12; H01G 5/14; C23C 16/00; G08C 19/10; G01L 9/00; G01L 1/14; G01L 1/142; G01L 25/00; G01L 5/165; G01D 5/2412; G01D 5/24
USPC .......... 324/660, 661, 662, 658, 663, 686.361, 324/696.28
See application file for complete search history.

(56) References Cited

U.S. PATENT DOCUMENTS

| | | | | |
|---|---|---|---|---|
| 3,189,803 | A * | 6/1965 | Doba, Jr. .................... | 361/299.2 |
| 3,784,897 | A * | 1/1974 | Norrie ...................... | 340/870.37 |
| 3,860,918 | A * | 1/1975 | Cencel ........................ | 324/660 |
| 4,780,663 | A * | 10/1988 | Mulder ...................... | 73/304 R |
| 4,963,829 | A * | 10/1990 | Wereb ........................ | 324/660 |
| 5,136,286 | A * | 8/1992 | Veneruso ................ | 340/870.37 |
| 5,144,841 | A * | 9/1992 | Brouwers et al. .............. | 73/706 |
| 6,147,855 | A * | 11/2000 | Taylor, Jr. ..................... | 361/277 |
| 2008/0209876 | A1* | 9/2008 | Miller ............................ | 55/522 |
| 2010/0162832 | A1* | 7/2010 | Brauers .................... | 73/862.626 |
| 2012/0029819 | A1* | 2/2012 | Mastrangelo et al. ........ | 701/472 |

* cited by examiner

*Primary Examiner* — Amy He
(74) *Attorney, Agent, or Firm* — NSIP Law

(57) ABSTRACT

There is provided a capacitor sensor capable of controlling sensitivity, wherein the capacitor sensor measures the magnitude and direction of a shear force applied to the sensor, as well as the magnitude of a normal force applied on the surface of the sensor, and consists of a single cell including a pattern electrode capable of varying its shape to control the sensitivity of the sensor.

10 Claims, 5 Drawing Sheets

CAPACITOR SENSOR CAPABLE OF CONTROLLING SENSITIVITY

CROSS-REFERENCE TO RELATED APPLICATION

This application claims priority to and the benefit of Korean Patent Application No. 2011-0078879, filed on Aug. 9, 2011, the disclosure of which is incorporated herein by reference in its entirety.

BACKGROUND

1. Field of the Invention

The present invention relates to a capacitor sensor capable of controlling sensitivity, wherein the capacitor sensor can measure the magnitude and direction of a shear force applied to the sensor, as well as the magnitude of a normal force applied on the surface of the sensor, and consists of a single cell including a pattern electrode capable of varying its shape to control the sensitivity of the sensor.

2. Discussion of Related Art

A capacitor sensor measures a change in capacitance caused by an external force to sense the external force. The capacitor sensor includes a dielectric material and electrodes disposed at both sides of the dielectric material.

A conventional capacitive sensor measured a change in capacitance due to a change in area and depth caused by a force applied to a sensing surface, and estimated the magnitude and direction of the force based on the change in capacitance. An example of such a conventional capacitive sensor is shown in FIG. 1. As shown in FIG. 1, the conventional capacitive sensor measures a change in capacitance of each of four cells to estimate the magnitude and direction of a force applied from the outside. Technology related to the conventional capacitive sensor is disclosed in "Normal and Shear Force Measurement Using a Flexible Polymer Tactile Sensor with Embedded Multiple Capacitors", Journal of Microelectromechanical Systems, vol. 17, No. 4, August 2008.

As such, in the conventional technology, in order to measure the magnitude and direction of an external force, four cells needed to be used, which makes the structure of a capacitor sensor complicated. Accordingly, there is increasing demand for a sensor having a simple structure and capable of controlling sensitivity.

SUMMARY OF THE INVENTION

According to an aspect of the present invention, there is provided a capacitor sensor capable of adjusting sensitivity, including: capacitor made of a dielectric material with a unique permittivity as an incompressible synthetic dielectric elastomer and having two surfaces that are opposite to each other; two electrodes respectively disposed on the two surfaces of the capacitor, each of the two electrodes formed in a 2-dimensional shape whose width tapers off in one direction, the two electrodes tapering in opposite directions, and a degree to which each of the electrodes tapers being variable; and a capacitance measurer connected to each of the two electrodes, wherein the electrodes partially overlap each other as seen from above, and when a shear force is applied to the capacitor sensor, the overlapping area of the electrodes changes, and the capacitance measurer measures the change of the overlapping area.

Each electrode is in the shape of a triangle, a trapezoid, or a parabola, and a part at which the electrode tapers off is a vertex part of the triangle, a narrow part of the trapezoid, or an inflection point part of the parabola.

If the electrodes are in the shapes of triangles, and the top vertices of the triangles face in opposite directions, angles of the top vertices of the triangles are adjusted to thereby control sensitivity of the capacitor sensor.

As the angle of the vertex of each triangle increases, the sensitivity of the capacitor sensor increases, and as the angle of the vertex of the triangle decreases, the sensitivity of the capacitor sensor decreases.

If the electrodes are in the shapes of parabolas, and the inflection points of the parabolas face in opposite directions, angles of the inflection points of the parabolas are adjusted to thereby control sensitivity of the capacitor sensor.

As the curvature of each parabola decreases, the sensitivity of the capacitor sensor increases, and as the curvature of the parabola increases, the sensitivity of the capacitor sensor decreases.

If the electrodes are in the shapes of trapezoids, and the obtuse angles of the trapezoids face in opposite directions, the obtuse angles of the trapezoids are adjusted to thereby control sensitivity of the capacitor sensor.

As the obtuse angles of each trapezoid increase, the sensitivity of the capacitor sensor increases, and as the obtuse angles of the trapezoid decreases, the sensitivity of the capacitor sensor decreases.

The synthetic dielectric elastomer is one of synthetic polymer, synthetic urethane, and synthetic silicon.

The electrodes are made of carbon paste or conductive silicon.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

1. Measurement of an Applied Force Through a Capacitor Sensor.

Figure 1:
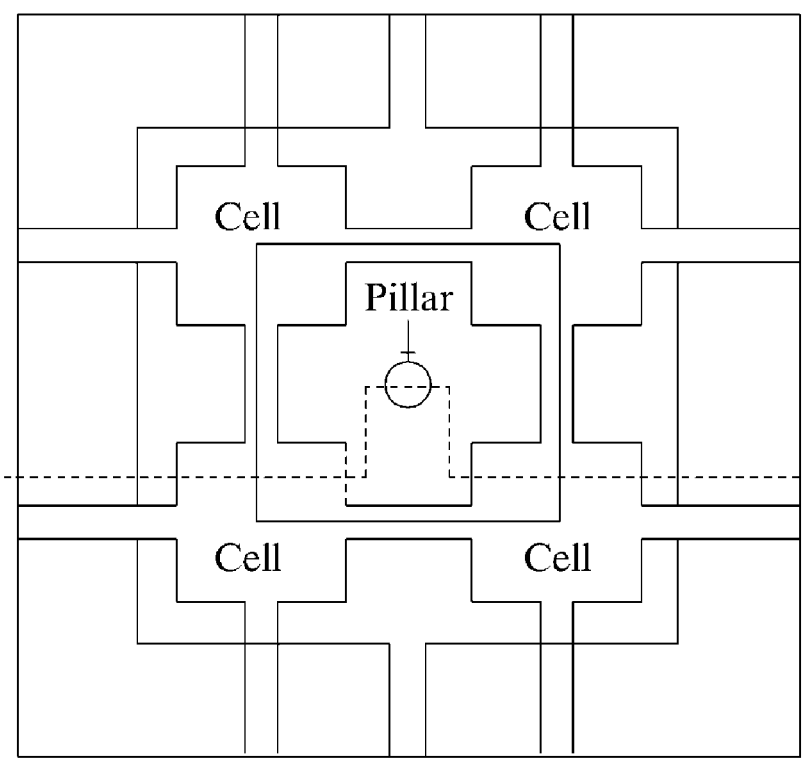
FIG. 1 shows an example of a conventional capacitor sensor for measuring the magnitude and direction of a force applied from the outside.
Figure 2:
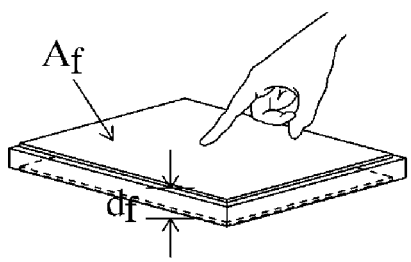
FIG. 2 is a view for explaining changes in capacitance when external forces are applied to a capacitor sensor.
Figure 2:
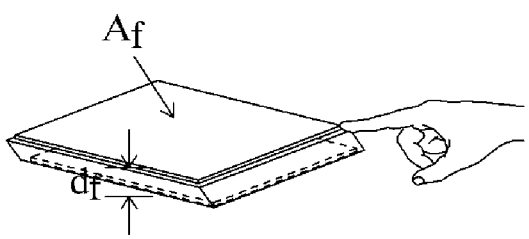

A capacitor sensor 100 includes a dielectric material and electrodes (referred to as upper and lower electrodes) disposed at both sides of the dielectric material. Referring to FIG. 2, when a normal force or a shear force is applied to the capacitor sensor 100, the overlapping area (when seen from above) of the upper and lower electrodes changes or the depth of the dielectric material changes. The change in overlapping area or the change in depth changes capacitance, and the changed capacitance is measured to estimate the applied force.

The capacitance of the capacitor sensor 100 can be calculated using the equation below:

$$C = \epsilon_0 \times \epsilon_1 \times A/d,$$

where A represents the area (m$^2$) of each capacitor plate, $\epsilon_0$ represents the absolute permittivity of free space, $\epsilon_1$ represents the relative permittivity of the dielectric material, and d represents the distance between capacitor plates.

Figure 3:
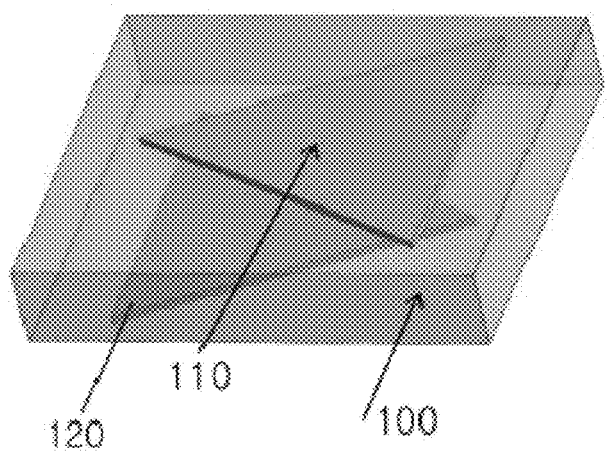
FIG. 3 is a perspective view illustrating an example of a capacitor sensor.

FIG. 3 is a perspective view illustrating an example of the capacitor sensor 100. As shown in FIG. 3, the capacitor sensor 100 includes a dielectric (a capacitor) made of a dielectric material having a unique permittivity, and upper and lower electrodes 110 and 120 that are opposite to each other with the capacitor therebetween. Each of the upper and lower electrodes 110 and 120 is connected to a capacitance measurer (not shown) for measuring a change in capacitance of the capacitor.

If a normal force (a vertical force) is applied to the capacitor sensor 100, the depth of the capacitor changes, thereby changing the capacitance of the capacitor. The changed capacitance is measured to thereby estimate the magnitude of the normal force.

Meanwhile, if a shear force is applied to the capacitor sensor 100, the overlapping area of the upper and lower electrodes 110 and 120 changes, thereby changing the capacitance of the capacitor. The changed capacitance is measured to thereby measure the magnitude of the shear force.

2. Structure of the Capacitor Sensor

The capacitor of the capacitor sensor 100 is made of a dielectric material having a unique permittivity. The dielectric material may be a synthetic dielectric elastomer. The synthetic dielectric elastomer may be one of synthetic polymer, synthetic urethane, and synthetic silicon. Since the synthetic dielectric elastomer has incompressibility, its volume stays constant even when an external force or pressure is applied thereto. That is, an external force or pressure applied to the synthetic dielectric elastomer changes the area (A) or depth (D) of the synthetic dielectric elastomer so as to change capacitance.

The synthetic dielectric elastomer has constant capacitance depending on its depth, area, and permittivity. The upper and lower electrodes 110 and 120 of the synthetic dielectric elastomer preferably have high electric conductivity and excellent flexibility so that the electrodes are neither modified when a low pressure is applied thereto nor permanently modified even when a high pressure is applied, in order to improve the performance and accuracy of the capacitor sensor 100. The upper and lower electrodes 110 and 120 are preferably made of carbon paste or conductive silicon. Alternatively, the upper and lower electrodes 110 and 120 may be formed by depositing metal thin films.

Meanwhile, each of the upper and lower electrodes 110 and 120 is formed in a 2-dimensional shape whose width tapers off in one direction. The upper and lower electrodes 110 and 120 taper off in opposite directions.

Also, a degree to which each of the upper and lower electrodes 110 and 120 tapers is variable. That is, each of the upper and lower electrodes 110 and 120 may have an arbitrary 2-dimensional shape as long as its width tapers off in one direction. The 2-dimensional shape may be a triangle, a parabolic shape, or a trapezoid. Also, variability in degree to which each electrode 110 or 120 tapers may be implemented by manufacturing the electrode 110 or 120 as a structure capable of being folded and stretched, like a folding fan, or by adding a non-conductive material for selectively covering the electrode 110 or 120. However, the present invention is not limited to these.

For example, if the upper and lower electrodes 110 and 120 are in the shapes of triangles and the corresponding top vertices of the triangles face in opposite directions, the angles of the top vertices may be adjusted to control the sensitivity of the sensor. As another example, if the upper and lower electrodes 110 and 120 are in the shapes of parabolas and the corresponding inflection points of the parabolas face in opposite directions, the curvatures of the parabolas may be adjusted to control the sensitivity of the sensor. As another example, if the upper and lower electrodes 110 and 120 are in the shapes of trapezoids and the corresponding narrow portions of the trapezoids face in opposite directions, the obtuse angles of the parabolas may be adjusted to control the sensitivity of the sensor.

An example where triangle-shaped electrodes are used and the sensitivity of the corresponding sensor is controlled by adjusting the top angles of the triangles will be described in detail with reference to FIG. 9, later.

3. Measurement of the Magnitude and Direction of a Shear Force.

Figure 5:
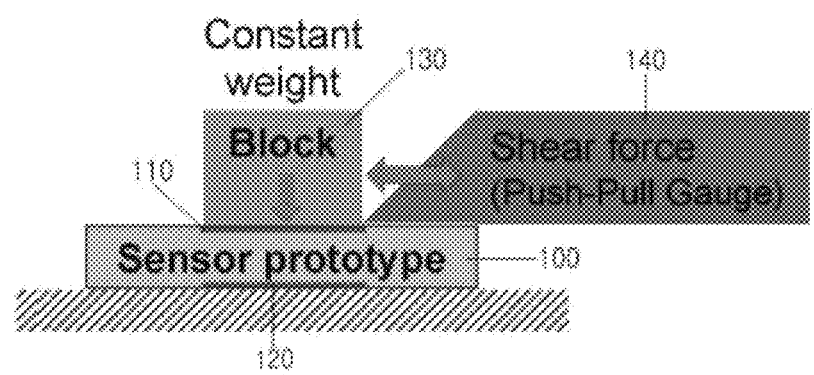
FIG. 5 shows an example of a device for applying a shear force to the capacitor sensor of FIG. 3.

FIG. 5 shows an example of a device for applying a shear force to the capacitor sensor 100 of FIG. 3, in order to measure the magnitude and direction of the shear force. As shown in FIG. 5, a block 130 with a predetermined weight is placed on the capacitor sensor 100, and a push-pull gauge 140 for applying a shear force to the block 130 is provided.

Figure 4:
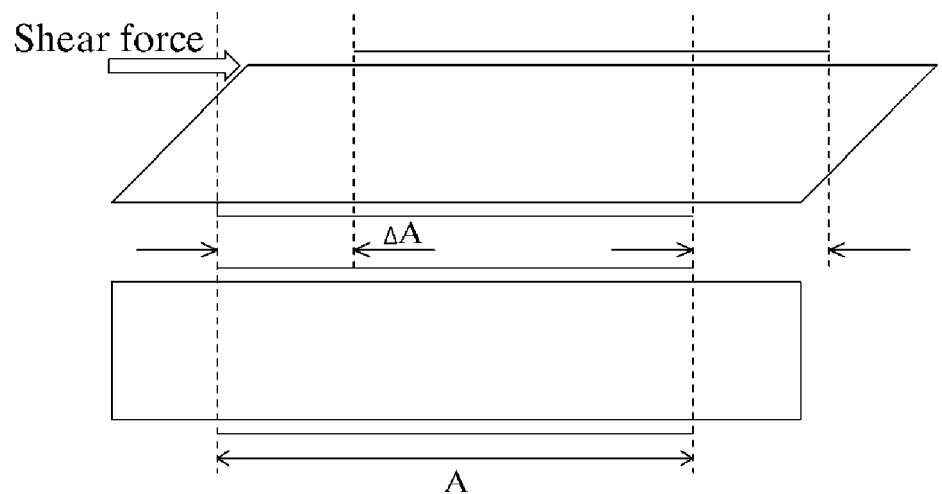
FIG. 4 is a view for explaining a phenomenon that occurs when a shear force is applied to the capacitor sensor of FIG. 3.

As shown in FIG. 4, if a shear force from left to right is applied to the upper surface of the capacitor sensor 100, the capacitor sensor 100 is modified so that the overlapping area of the upper and lower electrodes changes.

By using specific shapes of electrodes shown in FIG. 3 as the upper and lower electrodes, the overlapping area of the upper and lower electrodes changes according to the direction in which a shear force is applied, thereby changing capacitance.

Figure 6:
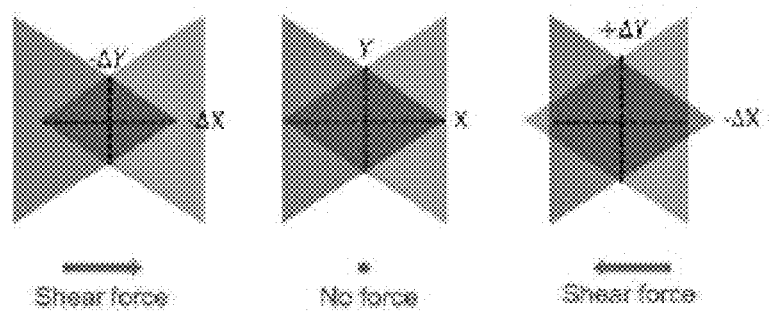
FIG. 6 shows examples in which the overlapping area of electrodes varies according to directions in which a shear force is applied.

Referring to FIG. 6, the center part of FIG. 6 shows the case where no shear force is applied to a capacitor sensor, wherein the overlapping area of the upper and lower electrodes is represented in purple, a red triangle represents the upper electrode, and a blue triangle represents the lower electrode.

The left part of FIG. 6 shows the case where a shear force from left to right is applied to the upper surface of the capacitor sensor. In this case, the upper electrode is pushed to the right, and accordingly, the overlapping area represented in purple decreases.

Meanwhile, the right part of FIG. 6 shows the case where a shear force from right to left is applied to the upper surface of the capacitor sensor. In this case, the upper electrode is pushed to the left, and accordingly, the overlapping area represented in purple increases.

As such, by measuring a change of capacitance due to an increase or decrease of the overlapping area, the magnitude and direction of an applied shear force may be estimated. For example, if a shear force has been applied to a capacitor sensor having triangle-shaped electrodes as shown in FIG. 3, and its capacitance has been reduced by the shear force, it can be estimated that the shear force has been applied in a direction from left to right. On the contrary, if the capacitance has increased by the shear force, it can be estimated that the shear force has been applied in a direction from right to left.

Measurement of the magnitude of a shear force by the capacitor sensor is based on pre-stored data. When predetermined magnitudes of shear forces are applied to a capacitor sensor having specific shapes of electrodes, changes in capacitance of the capacitor sensor are measured and recorded as data. The capacitance values with respect to the predetermined magnitudes of shear forces are calibrated, so that the relationship between shear force and capacitance can be expressed as an equation. Thereby, when the capacitor sensor is actually used, the capacitor sensor measures capacitance, thereby estimating the magnitude of an applied shear force using the equation.

4. Change in Sensitivity of Capacitor Sensor

According to an example, the sensitivity of the capacitor sensor can be controlled by changing the shapes of the upper and lower electrodes. As described above, the upper and lower electrodes are each formed in a 2-dimensional shape whose width tapers off in one direction, the upper and lower electrodes taper off in opposite directions, and also, a degree to which each of the upper and lower electrodes tapers is variable.

If each of the upper and lower electrodes has a triangle shape, the top angle of each triangle is adjusted to change the shape of the capacitor sensor, thereby controlling the sensitivity of the capacitor sensor.

The center part of FIG. 6 shows a case in which the overlapping area of the upper and lower electrodes is maximum, and the right and left parts show of FIG. 6 changes of the overlapping area. Referring to the right and left parts of FIG. 6, the overlapping area increases starting from when there is no overlapping area, becomes maximum at a specific point, and then decreases until there is no overlapping area. Meanwhile, each dotted line in FIG. 6 is the state of the overlapping area when the corresponding upper and lower electrodes are initially arranged.

When the top angle of each triangle is 30°, the change rate of the overlapping area is smallest, and accordingly, the sensitivity of the capacitor sensor is low. As the top angle of each triangle increases (60° and 120°), the sensitivity of the capacitor sensor increases accordingly.

As such, by adjusting the shapes of electrodes, it is possible to increase or decrease the sensitivity of the corresponding capacitor sensor. It will be also obvious to one of ordinary skill in the art that the example of adjusting the top angles of the triangle shapes of electrodes can be applied in the same manner to the cases where the electrodes have different shapes.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A capacitor sensor capable of adjusting sensitivity, comprising:
a capacitor made of a dielectric material, with a unique permittivity, as an incompressible synthetic dielectric elastomer and having two surfaces that are opposite to each other;
two electrodes respectively disposed on the two surfaces of the capacitor, each of the two electrodes formed in a 2-dimensional shape whose width tapers off in one direction, the two electrodes tapering in opposite directions, and a degree to which each of the electrodes tapers being variable; and
a capacitance measurer connected to each of the two electrodes, wherein:
the two electrodes partially overlap each other as seen from above, and
when a shear force is applied to the capacitor sensor, the overlapping area of the electrodes changes and the capacitance measurer determines the change of the overlapping area by measuring the change in capacitance resulting from the change in the overlapping area of the electrodes.

2. The capacitor sensor of claim 1, wherein:
each electrode is in the shape of a triangle, a trapezoid, or a parabola, and
a part at which the electrode tapers off is a vertex part of the triangle, a narrow part of the trapezoid, or an inflection point part of the parabola.

3. The capacitor sensor of claim 2, wherein if the electrodes are in the shapes of triangles and the top vertices of the triangles face in opposite directions, angles of the top vertices of the triangles are adjusted to thereby control sensitivity of the capacitor sensor.

4. The capacitor sensor of claim 3, wherein:
as the angle of the vertex of each triangle increases, the sensitivity of the capacitor sensor increases, and
as the angle of the vertex of the triangle decreases, the sensitivity of the capacitor sensor decreases.

5. The capacitor sensor of claim 2, wherein if the electrodes are in the shapes of parabolas and the inflection points of the parabolas face in opposite directions, angles of the inflection points of the parabolas are adjusted to thereby control sensitivity of the capacitor sensor.

6. The capacitor sensor of claim 5, wherein:
as the curvature of each parabola decreases, the sensitivity of the capacitor sensor increases, and
as the curvature of the parabola increases, the sensitivity of the capacitor sensor decreases.

7. The capacitor sensor of claim 2, wherein if the electrodes are in the shapes of trapezoids and the obtuse angles of the trapezoids face in opposite directions, the obtuse angles of the trapezoids are adjusted to thereby control sensitivity of the capacitor sensor.

8. The capacitor sensor of claim 7, wherein:
as the obtuse angles of each trapezoid increase, the sensitivity of the capacitor sensor increases, and
as the obtuse angles of the trapezoid decreases, the sensitivity of the capacitor sensor decreases.

9. The capacitor sensor of claim 1, wherein the synthetic dielectric elastomer is one of synthetic polymer, synthetic urethane, and synthetic silicon.

10. The capacitor sensor of claim 1, wherein the electrodes are made of carbon paste or conductive silicon.

* * * * *